United States Patent [19]

Chan et al.

[11] Patent Number: 4,679,300

[45] Date of Patent: Jul. 14, 1987

[54] METHOD OF MAKING A TRENCH CAPACITOR AND DRAM MEMORY CELL

[75] Inventors: Tsiu C. Chan, Carrollton; Yu-Pin Han, Dallas, both of Tex.

[73] Assignee: Thomson Components-Mostek Corp., Carrollton, Tex.

[21] Appl. No.: 785,195

[22] Filed: Oct. 7, 1985

[51] Int. Cl.[4] .................. H01L 27/10; H01C 11/24
[52] U.S. Cl. ................... 29/571; 29/576 B; 29/576 W; 29/576 C; 29/577 C; 29/580; 357/23.6; 156/643; 148/188
[58] Field of Search .......... 29/576 W, 576 C, 58, 29/571, 577 C; 148/DIG. 123, DIG. 35, DIG. 37, 188; 357/23, 51, 22 E; 156/643

[56] References Cited

U.S. PATENT DOCUMENTS

| | | | |
|---|---|---|---|
| 4,332,076 | 1/1982 | Zaldivar | 29/571 |
| 4,353,086 | 10/1982 | Jaccodine et al. | 357/51 |
| 4,397,075 | 8/1983 | Fatula, Jr. et al. | 29/571 |
| 4,455,740 | 6/1984 | Iwai | 29/571 |
| 4,604,150 | 8/1986 | Lin | 148/188 |

FOREIGN PATENT DOCUMENTS

| | | | |
|---|---|---|---|
| 0085988 | 8/1983 | European Pat. Off. | 29/571 |
| 0145606 | 6/1985 | European Pat. Off. | 357/23.6 |
| 0003269 | 1/1983 | Japan | 357/23.6 |

OTHER PUBLICATIONS

Minegishi, 'A Submicron CMOS Megabit Level Dynamic RAM Technology Using Doped Phase Trench Capacitor Cell', IEDM 1983, pp.-319-322.
Arai, 'Submicron MOS VLSI Process Technologies'; IEDM 1983, pp. 19-22.
Wada, 'A Folded Capacitor Cell (F.C.C.) for Future Megabit Drams,' IEDM 1984, pp. 244-247.
Sunami, 'A Corrugated Capacitor Cell (CCC) for Megabit Dynamic MOS Memories', IEDM 1982 pp. 806-808.

Primary Examiner—Brian E. Hearn
Assistant Examiner—Tom Thomas
Attorney, Agent, or Firm—Roland Plottel

[57] ABSTRACT

A method of making a trench capacitor employs an N-type switchable plate formed in a P-type substrate for holding charge at either zero volts or a positive TC voltage and a P-type ground plate that fills in a trench around a memory cell, so that P-type dopant diffuses through a thin oxide insulator to form a channel stop and a pinhold short through the oxide is self-healing by the formation of a reverse-biased P-N diode that cuts off the flow of current through the pinhole.

6 Claims, 5 Drawing Figures

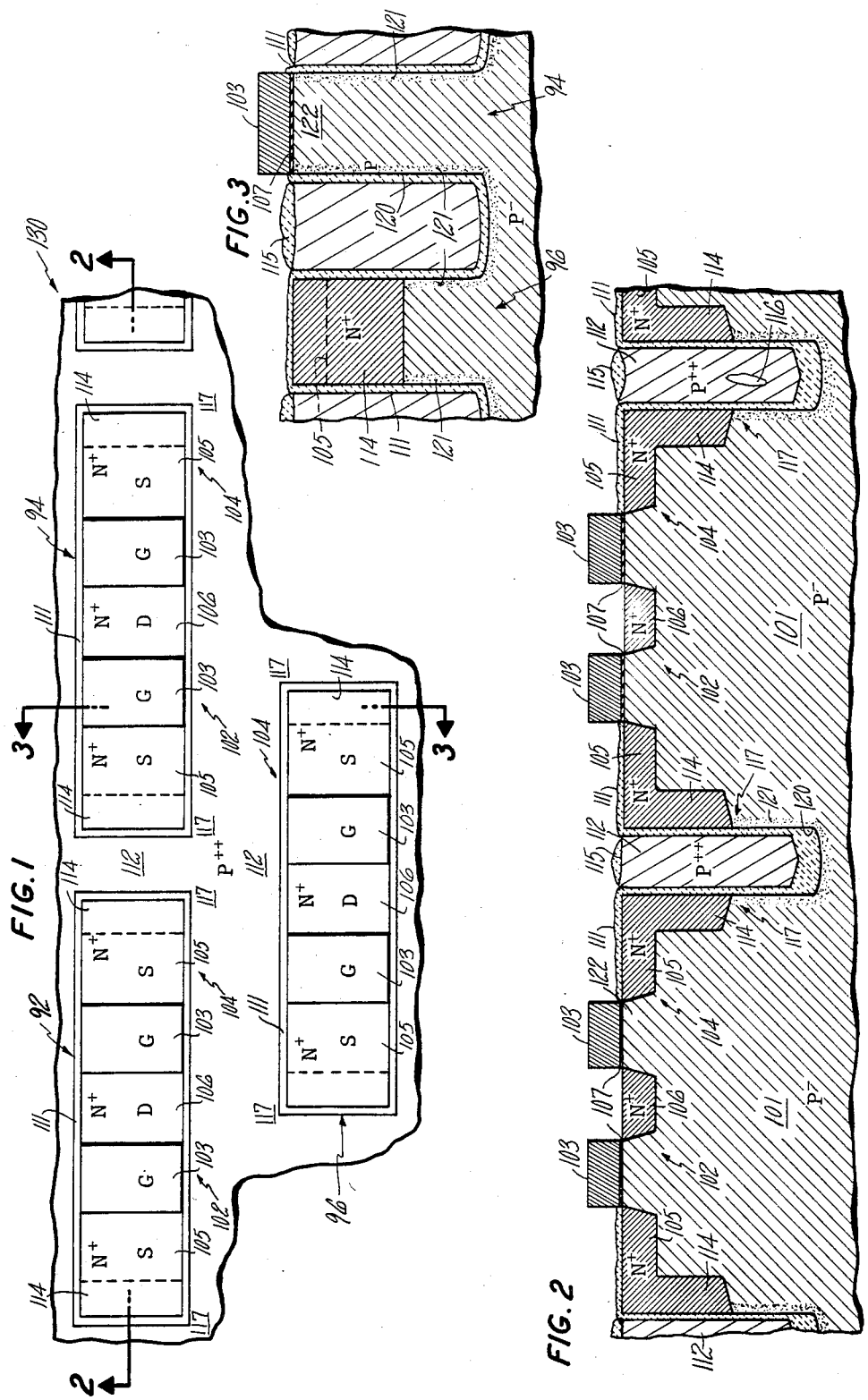

METHOD OF MAKING A TRENCH CAPACITOR AND DRAM MEMORY CELL

TECHNICAL FIELD

The field of the invention is the fabrication of vertical capacitors formed in the wall of a trench extending into a substrate.

REFERENCE TO RELATED APPLICATION

There has been filed concurrently with this application related application Ser. No. 758,196 having the same inventorship and a common assignee.

BACKGROUND ART

The use of trench capacitors for saving space in integrated circuits has been studied for some years. A convenient summary is an article by K. Minegishi et al. entitled "A Submicron CMOS Megabit Level Dynamic RAM Technology Using Doped Face Trench Capacitor Cell", IEDM '83.

DISCLOSURE OF INVENTION

The invention relates to an improved integrated circuit fabrication process for trench capacitor formation in which the bottom of the trench receives an effective field implant to prevent discharge of the capacitor, by diffusion of an impurity through an oxide coating lining the walls of the trench and in which the capacitor formed has the property of resisting short circuits through pinholes in the insulation.

A feature of the invention is the use of the improved capacitor in a compact one-transistor, one-capacitor memory cell.

BRIEF DESCRIPTION OF DRAWINGS

FIG. 1 illustrates a top view of portion of an integrated circuit containing capacitors constructed according to the invention.

FIG. 2 illustrates a cross section of one embodiment of the invention.

FIG. 3 illustrates a cross section of a different view of the elements shown in FIG. 1.

BEST MODE OF CARRYING OUT THE INVENTION

Figure 4A:
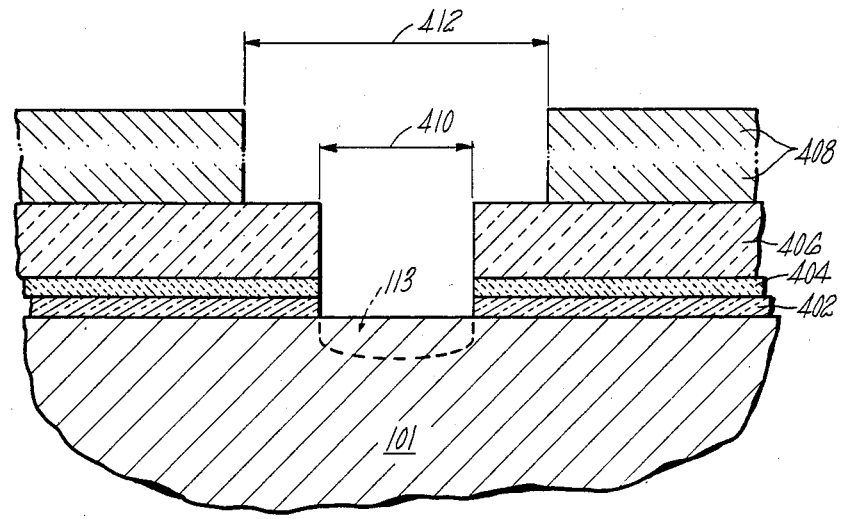
FIGS. 4a and 4b illustrate intermediate steps in the fabrication of a capacitor according to the invention.

The art has long sought a practial method of saving space in DRAMs and other integrated circuits that employ capacitors by orienting the capacitors vertically. There have been considerable practical difficulties blocking the implementation of this approach, including problems associated with yield that are related to short circuits through what is necessarily a thin and relatively irregular insulating oxide insulation and also to problems associated with capacitor discharge through parasitic channels formed within the substrate (not necessaily at the surface) that tend to discharge trench capacitors. This invention is directed at an improved method of forming trench capacitors that reduces the aforementioned problems.

Referring now to FIG. 1, there is shown in top view a portion of a portion of a DRAM memory array having one transistor, one capacitor cells constructed according to the invention. Three "islands" referred to by numerals 92, 94 and 96 are located in a "sea" of polysilicon denoted by the numeral 112, each island being surrounded by a layer of silicon oxide 111. The invention is addressed at forming compact capacitors resistant to pinhole shorts and excessive discharge. The particular circuit elements located on each island are a pair of transistors 102 and 104 sharing a common drain 106 and each having a separate source 105. Each source is connected to a capacitor 117 having a first plate 114 formed vertically into the substrate and a ground plate which is formed by polysilicon 112. Drain 106 will be connected to a metal column line that is omitted from the drawing for clarity, as is the row line that applies voltage to one or more memory cells. Conventionally, a row line will enable all the cells on the row, one or more of which will be accessed for data and all of which will be refreshed. Connections to the transistors and a layered oxide 111 over sources 105 are omitted to provide greater clarity in the drawing.

Referring now to FIG. 2, there is shown a cross section through line 2—2 of FIG. 1. This cross section extends through islands 92 and 94, separated by a trench 120 in the center of the drawing. The same two transistors 102 and 104 in each island formed in substrate 101 are shown with capacitor plates 114 on either side of trench 120. Trench 120 is lined with oxide 111 which also extends over source 105 and the top of capacitor plate 114. Trench 120 is filled with polysilicon 112 which is heavily doped, as is indicated by the P++ symbol. The polysilicon is protected by a field oxide 115. Two capacitors, referred to by the general numeral 117, are formed, sharing polysilicon 112 as a common ground plate and having oxide insulation 111 on either side of polysilicon 112. The two inner plates 114 complete the structure of capacitors 117. Plates 114 are electrically connected by common doping to sources 105.

There is a further element in the cross section, indicated by the numeral 121, comprising a doped region having the same polarity as the doping in trench 120 and surrounding trench 120, not only in the plane shown in the cross section but on the surface of the "sea" of polysilicon extending around and facing each island that is above and below the plane of FIG. 2. Doped area 121 is not shown as extending into plates 114 of capacitors 117 because the amount of doping is insufficient to change the type of impurity of plates 114. The concentration at the edge of oxide 111 is merely reduced slightly.

Another side view of the array of islands shown in FIG. 1, looking along line 3—3 in FIG. 1, is shown in FIG. 3. There, the section is taken through one of plates 114 in island 96 and through gate 103 of island 94, showing the bottom of source 105, the plate 114 itself, the oxide 111 that is formed on either side of islands 94 and 96 and extends down into the trench. Note that region 121 is shown as extending only up to capacitor plate 114 in island 96, but extends up to gate oxide 107 in island 94. This region 121 serves an equivalent function to a conventional field implant by raising the threshold of formation of parasitic channels. These channels can form between islands or along the surface of oxide 111 that faces the island. In particular, a channel could be formed on the vertical surface of oxide 111 that is underneath the gate source and drain, of a transistor thus effectively short-circuiting not only the transistor, but also plate 114 to drain 106. In planar circuits, the field implant suppresses the formation of parasitic channels. It has been a drawback of trench isolation methods in the prior art that there has been no effective way to provide the same suppression of the parasitic channels, and this is one of the problems that the present invention solves. The concentration of doped region 121 is indicated by P indicating a light concentration of approximately $5 \times 10^{16}$ ions per cc, near the vertical silicon surface in the substrate 101 outside the N+ areas, which is formed by diffusion of the heavily doped impurities within polysilicon 112 through oxide 111 and into substrate 101 surrounding the trench. It is necessary, of course, that the impurity used in trench 112 be capable of diffusing through thin oxide. Boron has that property and is a material well known in the art.

Figure 4B:
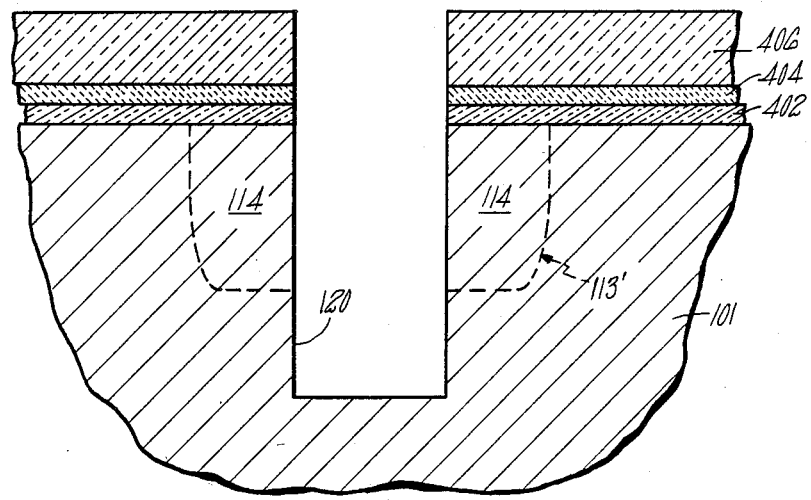

Further details of the process steps can be seen in FIGS. 4a and 4b. FIGS. 4a and 4b illustrate steps in the formation of a capacitor according to the invention in which an aperture having a width indicated by the arrow labeled 410, penetrates a series of layers comprising oxide layer 402 having an illustrative thickness of 500 angstroms, nitride layer 404 having an illustrative thickness of 1000 angstroms, and an oxide layer 406 having an illustrative thickness of 5000 angstroms. A further photoresist layer 408 having an aperture indicated by the arrow labeled 412 is placed above oxide layer 406 in order to define an ion implant area. Aperture 412 is made oversized in order to provide for alignment tolerance. A dose of phosphorus is implanted through aperture 410 in the region indicated by the numeral 113 with an illustrative concentration of $10^{15}$/centimeter$^2$. Aperture 410 may be formed by any convenient means known in the art, such as by reactive ion etching (RIE). In FIG. 4b, the results of a diffusion drive at a temperature of between 1,100 and 1,150 degrees centigrade for several hours has expanded area 113 into area 113' having a nominal width of 2.1 microns and a nominal depth of 2.5 microns. This area 113', which will become plates 114 of capacitor 117, is shown as being penetrated by trench 120 which is formed by a second step of reactive ion etching to a depth of between 3 and 3.5 microns. In the course of this second RIE step, part of oxide layer 406 is consumed. The thickness of layer 406 should, of course, be taken together with the properties of the particular RIE process being used so that the nitride layer 404 is protected during this step.

After trench 120 is cut, there are further steps of growing a layer of oxide on the interior surface of trench 120 to a nominal thickness of approximately 400 angstroms; stripping the oxide by a conventional wet etch proces and growing a final layer of oxide to a nominal thickness of 100 angstroms.

The trench is then filled by doped polycrystalline silicon formed in a standard process using, for example SiH$_4$ together with B$_2$H$_6$ at standard temperatures and pressures well known to those skilled in the art. The concentration of boron dopant in the polycrystalline silicon should be about $5 \times 10^{18}$ per cc. In filling such a deep, narrow trench, there may- well develop voids 116 within polysilicon 112. That is no problem in this invention because the only requirement for polysilicon 112 is that it form a conductive layer in the region of capacitor 117 and have a sufficient amount of polycrystalline silicon in the bottom of the trench to drive a sufficient quantity of boron in to form doped layer 121. This amount is non-critical, an advantageous feature of this invention.

After the doped polycrystalline layer has been deposited throughout the trench region, the portion of the polycrystalline silicon lying above the islands is etched away, as is the remainder of oxide layer 406. A field oxide region is then grown over polycrystalline silicon 112 to protect the trench and the remainder of the circuit elements on the island are formed in a conventional manner.

It is an advantageous feature of the invention that the doped polysilicon 112 in trench 120 is at the same potential as substrate 101, illustratively ground. There will often be small amounts of debris left from previous processing steps in the bottom of trench 120, which must have a small width to depth ratio in order to occupy as little room as possible. The debris could easily cause short circuits or diodes that could discharge capacitor 117 or otherwise interfere with the circuit. With the trench filling material of the same polarity and at the same potential as the substrate, any debris will be innocuous.

With a capacitor 117 is formed as shown in FIG. 2, there will be more stress on oxide 111, for a given oxide thickness, when polysilicon 112 is grounded than if it were at Vcc/2, but maintaining capacitor plate 112 at some intermediate voltage would risk shorts to the substrate 101.

A further advantageous feature of the invention is that, with polysilicon 112 doped with P-type material and plate 114 and transistor source 105 and drain 106, doped with N-type material, the effect of a pinhole or other defect in oxide 111 is reduced. It is well known that thinner oxides have more holes than thick ones and that the result of a hole is usually a short circuit that ruins the chip. For example, when a conventional five volt level is being stored in a memory cell, the bit line 106, source 105 and capacitor plate 114 of that cell will all be raised to five volts. If there is a pinhole through oxide 111 with this invention, the N+ region will be at plus five volts and the P++ region will be at ground. The region of plate 114 around the pinhole will be a P-N diode, reverse-baised at five volts, that will not conduct current. Short circuits through oxide 111 are thus "self-healing", resulting in greater yield than would be the case if a different combination of materials were used.

With this invention, the problems of parasitic channel discharge and of pinhole shorts are overcome, together with the avoidance of potential problems that might be caused by imperfect cleaning of the bottom of the trench.

The invention has been illustrated in the context of a conventional N-channel process and a DRAM memory cell. Those skilled in the art will readily be able to apply the principles of this invention to form capacitors in other circuits beside DRAMs, and to other combinations of voltage levels and doping materials.

We claim:

1. A method of fabricating a trench capacitor in an integrated circuit containing a plurality of circuit elements formed in a semiconductor substrate having a substrate conductivity type, comprising the steps of:

forming a protective layer on said substrate;

cutting an implant aperture having first and second aperture dimensions along first and second axes in said substrate, in a predetermined location in said substrate dimensions along said first and second axes, through said protective layer to said substrate;

implanting a predetermined dose of ions of conductivity type opposite to said substrate conductivity type;

diffusing said dose of ions into said substrate by heating said substrate to a predetermined temperature for a predetermined time such that a substantial concentration of said ions of said opposite conductivity type extends a predetermined distance from said implant aperture, whereby that portion of said dose of ions extending in said substrate below said predetermined capacitor plate location forms a plate conductive region extending downwardly into said substrate along a third axis and having first, second and third plate dimensions along said first, second and third axes;

cutting a trench into said substrate through said implant aperture, thereby forming a trench wall on that surface of said trench extending into said substrate through said plate conductive region with a wall area having a wall length greater than said first plate dimension along said first axis and a wall depth greater than said third plate dimension along said third axis;

growing a wall layer of silicon dioxide on said trench wall adjacent said plate conductive region and extending along said trench wall beyond said plate conductive region;

filling said trench with polycrystalline silicon filler heavily doped with a trench dopant material of the same conductivity type as said substrate conductivity type and having the capacity of diffusing through thin layers of silicon dioxide; and heating said substrate to a predetermined temperature for a predetermined time sufficient to diffuse a predetermined quantity of said trench dopant material through said wall layer of silicon dioxide to form a diffused channel stop region disposed about said plate conductive region in that portion of said silicon substrate abutting said trench wall and outside said first and third plate dimensions, whereby a parallel-plate capacitor is formed, one plate of which consists of said conductive plate region and the other plate of which is formed by said heavily doped polycrystalline filler, which capcitor has improved resistance to discharge through the effect of said diffused channel stop region.

2. A method according to claim 1, further including a step of forming an electrical connection between said filler and said substrate, whereby said substrate and said filler remain at substantially the same potential.

3. A method according to claim 1, in which said substrate has P-type conductivity with a predetermined substrate dopant concentration and said filler has P-type conductivity with a filler dopant concentration approximately two orders of magnitude greater than said substrate dopant concentration, whereby said capacitor is self-healing when said filler is connected to ground and said plate switches between ground and a positive voltage.

4. A method according to claim 2, in which said substrate has P-type conductivity with a predetermined substrate dopant concentration and said filler has P-type conductivity with a filler dopant concentration approximately two orders of magnitude greater than said substrate dopant concentration, whereby said capacitor is self-healing when said filler is connected to ground and said plate switches between ground and a positive voltage.

5. A method according to claim 3, in which said step of cutting a trench further includes a step of defining a trench aperture including said implant aperture and forming a memory cell area enclosed by said trench and further comprising the steps of forming in said memory cell area an N-channel insulated gate field effect transistor having an N-type electrode formed in said substrate abutting and connected to said conductive plate region, thereby forming a one-transistor/one-capacitor memory cell surrounded by said trench and by said diffused channel stop region.

6. A method according to claim 4, in which said step of cutting a trench further includes a step of defining a trench aperture including said implant aperture and forming a memory cell area enclosed by said trench and further comprising the steps of forming in said memory cell area an N-channel insulated gate field effect transistor having an N-type electrode formed in said substrate abutting and connected to said conductive plate region, thereby forming a one-transistor/one-capacitor memory cell surrounded by said trench and by said diffused channel stop region.

* * * * *